US012603613B2

(12) United States Patent
Yamashita et al.

(10) Patent No.: US 12,603,613 B2
(45) Date of Patent: Apr. 14, 2026

(54) AMPLITUDE AND PHASE CONTROL DEVICE, AMPLITUDE AND PHASE CONTROL METHOD, AMPLIFICATION DEVICE, AND RADIO TRANSMITTER

(71) Applicant: Mitsubishi Electric Corporation, Tokyo (JP)

(72) Inventors: Ao Yamashita, Tokyo (JP); Hiroto Sakaki, Tokyo (JP); Nobuhiko Ando, Tokyo (JP); Hideyuki Nakamizo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 545 days.

(21) Appl. No.: 17/885,796

(22) Filed: Aug. 11, 2022

(65) Prior Publication Data
US 2022/0393648 A1     Dec. 8, 2022

Related U.S. Application Data

(63) Continuation of application No. PCT/JP2020/013927, filed on Mar. 27, 2020.

(51) Int. Cl.
| | |
|---|---|
| H03F 1/02 | (2006.01) |
| H03F 3/24 | (2006.01) |
| H04B 1/04 | (2006.01) |

(52) U.S. Cl.
CPC ........... H03F 1/0288 (2013.01); H03F 3/245 (2013.01); H04B 1/0475 (2013.01); H03F 2200/451 (2013.01)

(58) Field of Classification Search
CPC .. H03F 1/0288; H03F 3/245; H03F 2200/451; H03F 1/3247; H03F 1/3282;
(Continued)

(56) References Cited

U.S. PATENT DOCUMENTS

| | | | |
|---|---|---|---|
| 2005/0213685 A1* | 9/2005 | Takabayashi | H03F 1/3294 |
| | | | 375/296 |
| 2010/0158155 A1* | 6/2010 | Borkar | H03F 1/3247 |
| | | | 330/149 |

(Continued)

FOREIGN PATENT DOCUMENTS

JP          2010-258578 A      11/2010

OTHER PUBLICATIONS

Extended European Search Report issued Mar. 29, 2023 in corresponding European Patent Application No. 20 927 908.2.
(Continued)

*Primary Examiner* — Yuwen Pan
*Assistant Examiner* — Fatuma G Sherif
(74) *Attorney, Agent, or Firm* — Birch, Stewart, Kolasch & Birch, LLP

(57) ABSTRACT

An amplitude and phase control device includes a signal dividing unit to divide a transmission signal into first and second signals and output the first and second signals to a Doherty amplifier, an error calculating unit to acquire, from the Doherty amplifier, a synthesized signal of first and second signals amplified by the Doherty amplifier, multiply the synthesized signal by a reciprocal of a gain of the Doherty amplifier, and calculate an error between a synthesized signal after being multiplied by the reciprocal and the transmission signal, and a controlling unit to control an amplitude of each of the first signal and the second signal output from the signal dividing unit depending on the error calculated by the error calculating unit, and control a phase difference between the first signal output from the signal dividing unit and the second signal output from the signal dividing unit depending on the error.

16 Claims, 8 Drawing Sheets

(58) Field of Classification Search
CPC ....... H03F 3/195; H03F 3/211; H04B 1/0475;
H04B 2001/0433
See application file for complete search history.

(56) References Cited

U.S. PATENT DOCUMENTS

2013/0321075 A1    12/2013  Fonden et al.
2020/0028473 A1*    1/2020  Doi ......................... H03F 1/025

OTHER PUBLICATIONS

European Communication pursuant to Article 94(3) EPC for European Application No. 20 927 908.2, dated Jan. 18, 2024.
Ding et al., "A Robust Digital Baseband Predistorter Constructed Using Memory Polynomials," IEEE Transactions on Communications, vol. 52, No. 1, Jan. 2004, pp. 159-165.
Komatsuzaki et al., "A Novel 1.4-4.8 GHz Ultra-Wideband, over 45% High Efficiency Digitally Assisted Frequency-Periodic Load Modulated Amplifier", IEEE/MTT-S International Microwave Symposium, Boston, MA, 2019, pp. 706-709.

* cited by examiner

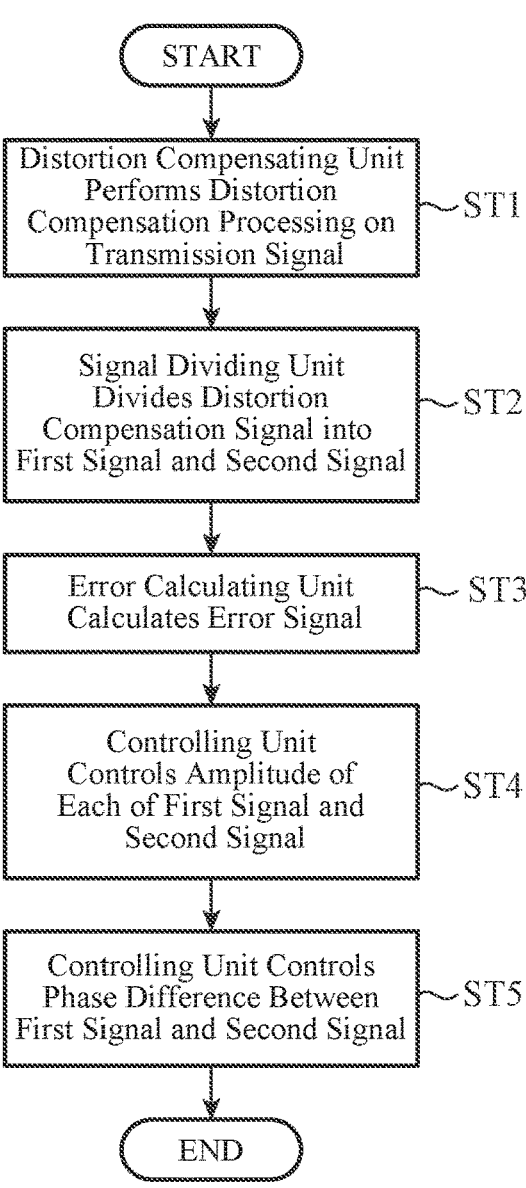

START

↓

Distortion Compensating Unit
Performs Distortion
Compensation Processing on
Transmission Signal  ~ST1

↓

Signal Dividing Unit
Divides Distortion
Compensation Signal into
First Signal and Second Signal  ~ST2

↓

Error Calculating Unit
Calculates Error Signal  ~ST3

↓

Controlling Unit
Controls Amplitude of
Each of First Signal and
Second Signal  ~ST4

↓

Controlling Unit Controls
Phase Difference Between
First Signal and Second Signal  ~ST5

↓

END

FIG. 6

| Error $e^{(i)}$ | First Amplitude Coefficient $amp_1$ | Second Amplitude Coefficient $amp_2$ | Phase Difference $\Delta ph$ |
|---|---|---|---|
| $0 < e^{(i)} \leq 5$ | $amp_{1,1}$ | $amp_{2,1}$ | $\Delta ph_1$ |
| $5 < e^{(i)} \leq 10$ | $amp_{1,2}$ | $amp_{2,2}$ | $\Delta ph_2$ |
| $10 < e^{(i)} \leq 15$ | $amp_{1,3}$ | $amp_{2,3}$ | $\Delta ph_3$ |
| $15 < e^{(i)} \leq 20$ | $amp_{1,4}$ | $amp_{2,4}$ | $\Delta ph_4$ |

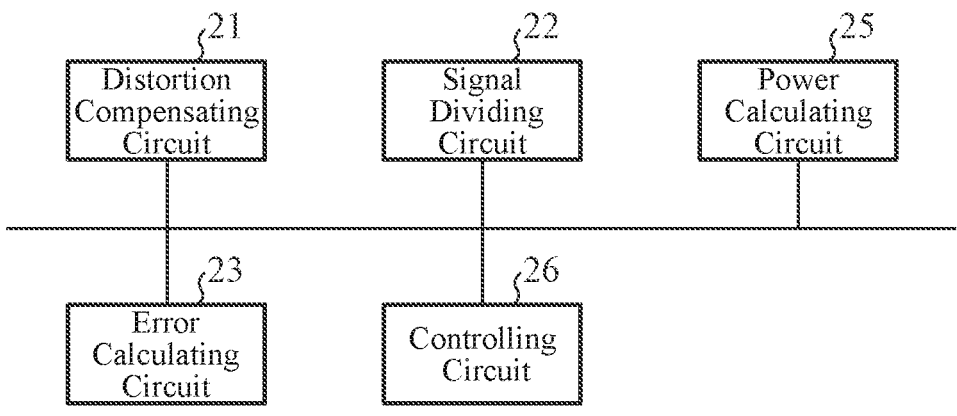

FIG. 10

| Carrier Wave Frequency f | Power P | Error $e^{(i)}$ | First Amplitude Coefficient $amp_1$ | Second Amplitude Coefficient $amp_2$ | Phase Difference $\Delta ph$ |
|---|---|---|---|---|---|
| $f_1$ | $P_1$ | $0 < e^{(i)} \leq 5$ | $amp_{1,1}$ | $amp_{2,1}$ | $\Delta ph_1$ |
| | | $5 < e^{(i)} \leq 10$ | $amp_{1,2}$ | $amp_{2,2}$ | $\Delta ph_2$ |
| | | $\vdots$ | $\vdots$ | $\vdots$ | $\vdots$ |
| | $P_2$ | $0 < e^{(i)} \leq 5$ | $amp_{1,11}$ | $amp_{2,11}$ | $\Delta ph_{11}$ |
| | | $5 < e^{(i)} \leq 10$ | $amp_{1,12}$ | $amp_{2,12}$ | $\Delta ph_{12}$ |
| | | $\vdots$ | $\vdots$ | $\vdots$ | $\vdots$ |
| | $\vdots$ | $\vdots$ | $\vdots$ | $\vdots$ | $\vdots$ |
| $f_2$ | $P_1$ | $0 < e^{(i)} \leq 5$ | $amp_{1,21}$ | $amp_{2,21}$ | $\Delta ph_{21}$ |
| | | $5 < e^{(i)} \leq 10$ | $amp_{1,22}$ | $amp_{2,22}$ | $\Delta ph_{22}$ |
| | | $\vdots$ | $\vdots$ | $\vdots$ | $\vdots$ |
| | $P_2$ | $0 < e^{(i)} \leq 5$ | $amp_{1,31}$ | $amp_{2,31}$ | $\Delta ph_{31}$ |
| | | $5 < e^{(i)} \leq 10$ | $amp_{1,32}$ | $amp_{2,32}$ | $\Delta ph_{32}$ |
| | | $\vdots$ | $\vdots$ | $\vdots$ | $\vdots$ |
| | $\vdots$ | $\vdots$ | $\vdots$ | $\vdots$ | $\vdots$ |

FIG. 11

AMPLITUDE AND PHASE CONTROL DEVICE, AMPLITUDE AND PHASE CONTROL METHOD, AMPLIFICATION DEVICE, AND RADIO TRANSMITTER

CROSS REFERENCE TO RELATED APPLICATIONS

This application is a Continuation of PCT International Application No. PCT/JP2020/013927, filed on Mar. 27, 2020, which is hereby expressly incorporated by reference into the present application.

TECHNICAL FIELD

The present disclosure relates to an amplitude and phase control device and an amplitude and phase control method to output each of a first signal and a second signal to a Doherty amplifier, an amplification device provided with the amplitude and phase control device and the Doherty amplifier, and a radio transmitter provided with the amplification device.

BACKGROUND ART

In an amplifier used in a radio transmitter, distortion included in an amplified transmission signal is required to be small.

Following Non-Patent Literature 1 discloses a distortion compensating circuit that reduces distortion included in an output signal of an amplifier. The distortion compensating circuit generates a distortion compensation signal capable of reducing distortion included in the output signal of the amplifier using a model indicating an inverse characteristic of a non-linear characteristic of the amplifier, and applies the distortion compensation signal to the amplifier as a signal to be amplified.

Hereinafter, generation processing of the distortion compensation signal by the distortion compensating circuit is specifically described.

The distortion compensating circuit multiplies an output signal y(n) of the amplifier by a reciprocal of a gain of the amplifier, and calculates an error e(n) between an output signal z(n) hat after being multiplied by the reciprocal and a distortion compensation signal z(n). In the description of this specification, it is not possible to attach a symbol "^" on a character z due to the electronic filing application, so that this is represented as z(n) hat. The symbol n represents a sample number.

The distortion compensating circuit calculates a compensation coefficients $a_{k,q}$ of a model that minimizes the error e(n). Since the model has (K×Q) compensation coefficients $a_{k,q}$, the distortion compensating circuit calculates (K×Q) compensation coefficients $a_{k,q}$. K is a fixed value (integer) equal to or larger than one set depending on the non-linear characteristic of the amplifier, and corresponds to the order of a function representing the model. When the model indicating the inverse characteristic of the non-linear characteristic in the amplifier can be expressed by, for example, a fifth-order function, K=5 is set. Q is an integer equal to or larger than one.

The distortion compensating circuit calculates the distortion compensation signal z(n) by substituting signals x(n), x(n−1), . . . , x(n−q), . . . , and x(n−Q−1) to be amplified for past Q samples and the calculated compensation coefficient $a_{k,q}$ in following equation (1).

$$z(n) = \sum_{k=1}^{K}\sum_{q=0}^{Q} a_{k,q} x(n-q)|x(n-q)|^{k-1} \tag{1}$$

The distortion compensating circuit outputs the distortion compensation signal z(n) to the amplifier.

CITATION LIST

Non-Patent Literature

Non-Patent Literature 1: Lei Ding, G. Tong Zhou, Dennis R. Morgan, Zhengxiand Ma, J. Stevenson Kenney, Jaehyeong, Kim, and Charles R. Giardina, "A robust digital baseband predistorter constructed using memory polynomial," IEEE Transactions on Communications, vol. 52, no. 1, January 2004.

SUMMARY OF INVENTION

Technical Problem

In the distortion compensating circuit disclosed in Non-Patent Literature 1, the number of compensation coefficients $a_{k,q}$ included in the model is fixed to (K×Q). For this reason, when the non-linear characteristic of the amplifier changes due to a change in temperature, deterioration over time or the like, there is a case where the model does not indicate the inverse characteristic of the non-linear characteristic of the amplifier. Therefore, there has been a problem that, when the non-linear characteristic of the amplifier changes, the distortion included in the output signal y(n) of the amplifier cannot be reduced in some cases even when the distortion compensation signal is generated using the (K×Q) compensation coefficients $a_{k,q}$.

The present disclosure has been made to solve the above-described problem, and an object thereof is to obtain an amplification device capable of reducing distortion included in a synthesized signal output from a Doherty amplifier even when a non-linear characteristic of the Doherty amplifier changes.

Solution to Problem

An amplitude and phase control device according to the present disclosure includes processing circuitry to divide, by a signal dividing circuit, a transmission signal into a first signal and a second signal, and output each of the first signal and the second signal to a Doherty amplifier, to acquire, from the Doherty amplifier, a synthesized signal of a first signal amplified by the Doherty amplifier and a second signal amplified by the Doherty amplifier, perform multiplication of the synthesized signal by a reciprocal of a gain of the Doherty amplifier, and perform calculation of an error between the synthesized signal after the multiplication by the reciprocal and the transmission signal, and to control an amplitude of each of the first signal and the second signal depending on an amplitude coefficient corresponding to the error when a number of times of the calculation of the error reaches a predetermined number of times every time when the number of times reaches the predetermined number of times, and control a phase difference between the first signal and the second signal depending on the phase difference corresponding to the error when the number of times reaches the predetermined number of times.

Advantageous Effects of Invention

According to the present disclosure, the distortion included in the synthesized signal output from the Doherty amplifier can be reduced even when the non-linear characteristic of the Doherty amplifier changes.

BRIEF DESCRIPTION OF DRAWINGS

FIG. 2 is a configuration diagram illustrating the amplification device 1 including an amplitude and phase control device 10 according to the first embodiment.

FIG. 4 is a hardware configuration diagram of a computer in a case where the amplitude and phase control device 10 is implemented by software, firmware or the like.

FIG. 5 is a flowchart illustrating a processing procedure performed by the amplitude and phase control device 10.

FIG. 6 is an explanatory diagram illustrating an example of a table included in a controlling unit 17.

FIG. 7 is a configuration diagram illustrating the amplification device 1 including another amplitude and phase control device 10 according to the first embodiment.

FIG. 9 is a hardware configuration diagram illustrating hardware of the amplitude and phase control device 10 according to the third embodiment.

FIG. 10 is an explanatory diagram illustrating an example of a table included in a controlling unit 19.

FIG. 11 is a configuration diagram illustrating the amplification device 1 including another amplitude and phase control device 10 according to the third embodiment.

DESCRIPTION OF EMBODIMENTS

Some modes for carrying out the present disclosure are hereinafter described with reference to the attached drawings in order to describe the present disclosure in further detail.

First Embodiment

Figure 1:
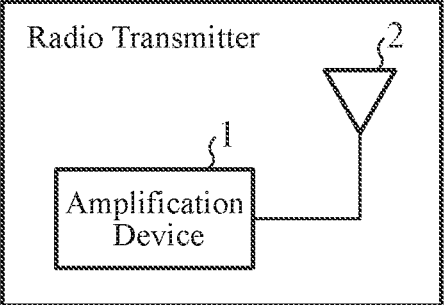
FIG. 1 is a configuration diagram illustrating a radio transmitter including an amplification device 1 according to a first embodiment.

FIG. 1 is a configuration diagram illustrating a radio transmitter including an amplification device 1 according to a first embodiment.

Figure 2:
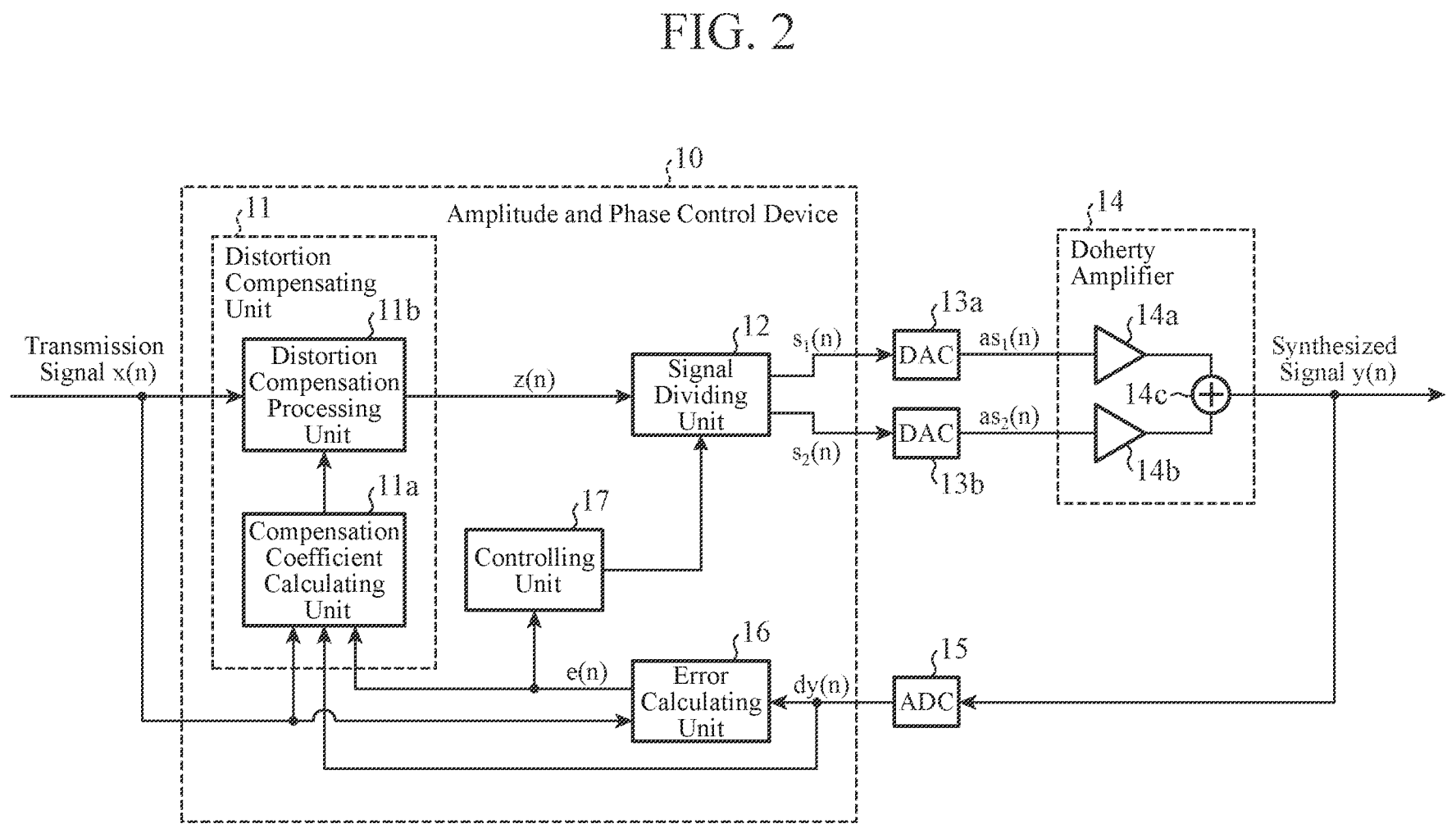

FIG. 2 is a configuration diagram illustrating the amplification device 1 including an amplitude and phase control device 10 according to the first embodiment.

Figure 3:
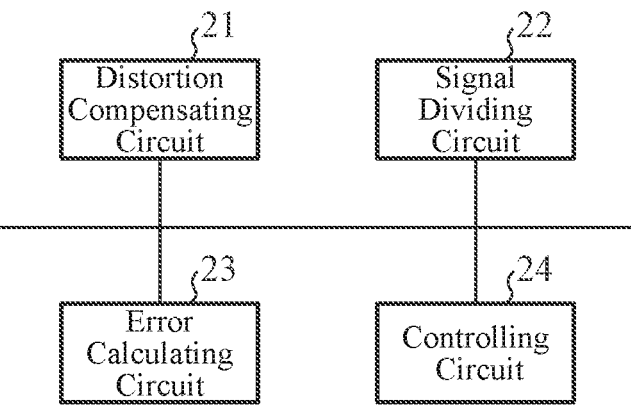
FIG. 3 is a hardware configuration diagram illustrating hardware of the amplitude and phase control device 10 according to the first embodiment.

FIG. 3 is a hardware configuration diagram illustrating hardware of the amplitude and phase control device 10 according to the first embodiment.

The radio transmitter is provided with the amplification device 1 and a transmission antenna 2.

The amplification device 1 amplifies a transmission signal that is a signal to be amplified, and outputs the amplified transmission signal to the transmission antenna 2.

The transmission antenna 2 emits a radio wave caused by the amplified transmission signal output from the amplification device 1 into space.

The amplification device 1 is provided with the amplitude and phase control device 10, digital-to-analog converters (hereinafter referred to as "DACs") 13*a* and 13*b*, a Doherty amplifier 14, and an analog-to-digital converter (hereinafter referred to as an "ADC") 15.

The amplitude and phase control device 10 is provided with a distortion compensating unit 11, a signal dividing unit 12, an error calculating unit 16, and a controlling unit 17.

The amplitude and phase control device 10 divides the transmission signal into a first signal and a second signal.

The amplitude and phase control device 10 outputs the first signal to the Doherty amplifier 14 via the DAC 13*a*, and outputs the second signal to the Doherty amplifier 14 via the DAC 13*b*.

The distortion compensating unit 11 is implemented by, for example, a distortion compensating circuit 21 illustrated in FIG. 3.

The distortion compensating unit 11 is provided with a compensation coefficient calculating unit 11*a* and a distortion compensation processing unit 11*b*.

The distortion compensating unit 11 generates a distortion compensation signal for reducing distortion included in a synthesized signal that is an output signal of the Doherty amplifier 14 by performing distortion compensation processing on the transmission signal, and outputs the distortion compensation signal to the signal dividing unit 12 as the transmission signal.

That is, the distortion compensating unit 11 generates the distortion compensation signal capable of reducing the distortion included in the synthesized signal that is the output signal of the Doherty amplifier 14 using a model indicating an inverse characteristic of a non-linear characteristic in the Doherty amplifier 14, and outputs the distortion compensation signal to the signal dividing unit 12.

The compensation coefficient calculating unit 11*a* calculates a compensation coefficient of the model that minimizes an error calculated by the error calculating unit 16 using the transmission signals for past Q samples and a digital synthesized signal output from the ADC 15.

The compensation coefficient calculating unit 11*a* outputs the compensation coefficient of the model to the distortion compensation processing unit 11*b*.

The distortion compensation processing unit 11*b* calculates the distortion compensation signal using the transmission signals for the past Q samples and the compensation coefficient calculated by the compensation coefficient calculating unit 11*a*, and outputs the distortion compensation signal to the signal dividing unit 12. Q is an integer equal to or larger than one.

The signal dividing unit 12 is implemented by a signal dividing circuit 22 illustrated in FIG. 3, for example.

The signal dividing unit 12 divides the distortion compensation signal output from the distortion compensating unit 11 into the first signal and the second signal.

The signal dividing unit 12 outputs the first signal to a carrier amplifier 14*a* of the Doherty amplifier 14 via the DAC 13*a*.

The signal dividing unit 12 outputs the second signal to a peak amplifier 14*b* of the Doherty amplifier 14 via the DAC 13*b*.

An amplitude of each of the first signal and the second signal output from the signal dividing unit 12 will be described later. A phase difference between the first signal output from the signal dividing unit 12 and the second signal output from the signal dividing unit 12 will be described later.

The DAC 13*a* converts the first signal output from the signal dividing unit 12 from a digital signal to an analog signal, and outputs the analog signal to the carrier amplifier 14*a* of the Doherty amplifier 14 as a first analog signal.

The DAC 13*b* converts the second signal output from the signal dividing unit 12 from a digital signal to an analog signal, and outputs the analog signal to the peak amplifier 14*b* of the Doherty amplifier 14 as a second analog signal.

The Doherty amplifier 14 is provided with the carrier amplifier 14*a*, the peak amplifier 14*b*, and a signal synthe- sizing unit 14*c*.

The Doherty amplifier 14 amplifies the first analog signal output from the DAC 13*a*, and amplifies the second analog signal output from the DAC 13*b*.

The Doherty amplifier 14 outputs a synthesized signal of the amplified first analog signal and the amplified second analog signal to each of the outside of the amplification device 1 and the ADC 15.

The carrier amplifier 14*a* amplifies the first analog signal output from the DAC 13*a*, and outputs the amplified first analog signal to the signal synthesizing unit 14*c*.

The peak amplifier 14*b* amplifies the second analog signal output from the DAC 13*b*, and outputs the amplified second analog signal to the signal synthesizing unit 14*c*.

The signal synthesizing unit 14*c* synthesizes the amplified first analog signal output from the carrier amplifier 14*a* and the amplified second analog signal output from the peak amplifier 14*b*.

The signal synthesizing unit 14*c* outputs the synthesized signal of the amplified first analog signal and the amplified second analog signal to each of the outside of the amplifi- cation device 1 and the ADC 15.

The ADC 15 converts the synthesized signal output from the signal synthesizing unit 14*c* from an analog signal to a digital signal, and outputs the digital signal to the error calculating unit 16 as the digital synthesized signal.

The error calculating unit 16 is implemented by an error calculating circuit 23 illustrated in FIG. 3, for example.

The error calculating unit 16 acquires the digital synthe- sized signal output from the ADC 15, and multiplies the digital synthesized signal by a reciprocal of a gain of the Doherty amplifier 14.

The error calculating unit 16 calculates an error between a digital synthesized signal after being multiplied by the reciprocal and the transmission signal, and outputs an error signal indicating the error to each of the controlling unit 17 and the distortion compensating unit 11.

The controlling unit 17 is implemented by a controlling circuit 24 illustrated in FIG. 3, for example.

The controlling unit 17 controls the amplitude of each of the first signal and the second signal output from the signal dividing unit 12 depending on the error calculated by the error calculating unit 16.

The controlling unit 17 controls the phase difference between the first signal output from the signal dividing unit 12 and the second signal output from the signal dividing unit 12 depending on the error calculated by the error calculating unit 16.

In FIG. 2, it is assumed that each of the distortion compensating unit 11, the signal dividing unit 12, the error calculating unit 16, and the controlling unit 17 that are components of the amplitude and phase control device 10 is implemented by dedicated hardware as illustrated in FIG. 3. That is, it is assumed that the amplitude and phase control device 10 is implemented by the distortion compensating circuit 21, the signal dividing circuit 22, the error calculating circuit 23, and the controlling circuit 24.

Each of the distortion compensating circuit 21, the signal dividing circuit 22, the error calculating circuit 23, and the controlling circuit 24 corresponds to, for example, a single circuit, a composite circuit, a programmed processor, a parallel-programmed processor, an application specific inte- grated circuit (ASIC), a field-programmable gate array (FPGA), or a combination thereof.

The components of the amplitude and phase control device 10 are not limited to those implemented by the dedicated hardware, and the amplitude and phase control device 10 may also be implemented by software, firmware, or a combination of the software and firmware.

The software or firmware is stored as a program in a memory of a computer. The computer is intended to mean hardware that executes the program, and corresponds to, for example, a central processing unit (CPU), a central proces- sor, a processing unit, an arithmetic unit, a microprocessor, a microcomputer, a processor, a digital signal processor (DSP) or the like.

Figure 4:
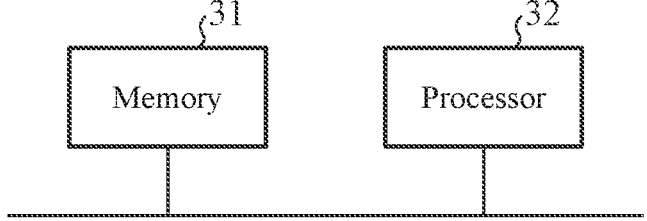

FIG. 4 is a hardware configuration diagram of the com- puter in a case where the amplitude and phase control device 10 is implemented by the software, firmware or the like.

In a case where the amplitude and phase control device 10 is implemented by the software, firmware or the like, the program for causing the computer to execute each process- ing procedure performed in the distortion compensating unit 11, the signal dividing unit 12, the error calculating unit 16, and the controlling unit 17 is stored in a memory 31. A processor 32 of the computer executes the program stored in the memory 31.

FIG. 3 illustrates an example in which each of the components of the amplitude and phase control device 10 is implemented by the dedicated hardware, and FIG. 4 illus- trates an example in which the amplitude and phase control device 10 is implemented by the software, firmware or the like. However, this is merely an example, and some com- ponents in the amplitude and phase control device 10 may be implemented by the dedicated hardware, and the remaining components may be implemented by the software, firmware or the like.

Next, an operation of the amplification device 1 illustrated in FIG. 2 is described.

FIG. 5 is a flowchart illustrating a processing procedure performed by the amplitude and phase control device 10.

The distortion compensating unit 11 acquires the trans- mission signal that is the signal to be amplified, performs the distortion compensation processing on the transmission sig- nal, and outputs the distortion compensation signal that is the transmission signal after the distortion compensation processing to the signal dividing unit 12 (step ST1 in FIG. 5).

Hereinafter, the distortion compensation processing by the distortion compensating unit 11 is specifically described.

The model indicating the inverse characteristic of the non-linear characteristic in the Doherty amplifier 14 is stored in an internal memory of the distortion compensating unit 11.

The compensation coefficient calculating unit 11*a* of the distortion compensating unit 11 acquires the transmission signals for the past Q samples.

That is, the compensation coefficient calculating unit 11*a* acquires $x(n)$, $x(n-1)$, . . . , $x(n-q)$, . . . , and $x(n-Q-1)$ as the transmission signals for the past Q samples. $x(n)$ is the transmission signal of the latest sample.

The compensation coefficient calculating unit 11*a* also acquires a digital synthesized signal $dy(n)$ of the latest sample from the ADC 15.

The compensation coefficient calculating unit 11a calculates a compensation coefficients $a_{k,q}$ of the model that minimize an error signal $\Delta e(n)$ (refer to following equation (3)) output from the error calculating unit 16 using the transmission signals x(n), x(n–1), . . . , x(n–q), . . . , and x(n–Q–1) for the past Q samples and the digital synthesized signal dy(n). Since the processing of calculating the compensation coefficient $a_{k,q}$ is known technique, detailed description thereof is omitted (refer to, for example, Non-Patent Literature 1).

The compensation coefficient calculating unit 11a outputs the compensation coefficient $a_{k,q}$ of the model to the distortion compensation processing unit 11b.

The distortion compensation processing unit 11b acquires the transmission signals x(n), x(n–1), . . . , x(n–q), . . . , and x(n–Q–1) for the past Q samples, and acquires the compensation coefficient $a_{k,q}$ output from the compensation coefficient calculating unit 11a.

The distortion compensation processing unit 11b calculates a distortion compensation signal z(n) by substituting the transmission signals x(n), x(n–1), . . . , x(n–q), . . . , and x(n–Q–1) for the past Q samples and the compensation coefficient $a_{k,q}$ of the model in following equation (2). K is an integer equal to or larger than one.

$$z(n) = \sum_{k=1}^{K} \sum_{q=0}^{Q} a_{k,q} x(n-q) |x(n-q)|^{k-1} \qquad (2)$$

The distortion compensation processing unit 11b outputs the distortion compensation signal z(n) to the signal dividing unit 12 as the transmission signal after the distortion compensation processing.

When the non-linear characteristic of the Doherty amplifier 14 is not changed due to a change in temperature, deterioration over time or the like, the distortion compensation processing unit 11b can generate the distortion compensation signal z(n) capable of reducing distortion included in a synthesized signal y(n) output from the Doherty amplifier 14 using (K×Q) compensation coefficients $a_{k,q}$. However, when the non-linear characteristic of the Doherty amplifier 14 is changed due to the change in temperature, deterioration over time or the like, the distortion compensation processing unit 11b cannot generate the distortion compensation signal z(n) capable of reducing the distortion included in the synthesized signal y(n) even by using the (K×Q) compensation coefficients $a_{k,q}$.

Note that, when an order of a function representing the model is appropriate, the larger the value of Q is, the more reduction accuracy of the distortion is improved. However, K is solely responsible for the order of the function representing the model, and the model itself is not appropriate when K does not indicate the appropriate order due to the change in temperature or the like. Therefore, even when the value of Q is set to a large value, the distortion cannot be reduced in some cases.

The signal dividing unit 12 divides the distortion compensation signal z(n) output from the distortion compensation processing unit 11b of the distortion compensating unit 11 to a first signal $s_1(n)$ and a second signal $s_2(n)$ (step ST2 in FIG. 5).

An amplitude of each of the first signal $s_1(n)$ and the second signal $s_2(n)$ output from the signal dividing unit 12 and a phase difference between the first signal $s_1(n)$ and the second signal $s_2(n)$ are controlled by the controlling unit 17. Control by the controlling unit 17 will be described later.

The signal dividing unit 12 outputs the first signal $s_1(n)$ to the DAC 13a, and outputs the second signal $s_2(n)$ to the DAC 13b.

The DAC 13a converts the first signal $s_1(n)$ output from the signal dividing unit 12 from a digital signal to an analog signal, and outputs the analog signal to the carrier amplifier 14a of the Doherty amplifier 14 as a first analog signal $as_1(n)$.

The DAC 13b converts the second signal $s_2(n)$ output from the signal dividing unit 12 from a digital signal to an analog signal, and outputs the analog signal to the peak amplifier 14b of the Doherty amplifier 14 as a second analog signal $as_2(n)$.

The carrier amplifier 14a amplifies the first analog signal $as_1(n)$ output from the DAC 13a, and outputs the amplified first analog signal $as_1(n)'$ to the signal synthesizing unit 14c.

The peak amplifier 14b amplifies the second analog signal $as_2(n)$ output from the DAC 13b, and outputs the amplified second analog signal $as_2(n)'$ to the signal synthesizing unit 14c.

The signal synthesizing unit 14c synthesizes the amplified first analog signal $as_1(n)'$ output from the carrier amplifier 14a and the amplified second analog signal $as_2(n)'$ output from the peak amplifier 14b.

The signal synthesizing unit 14c outputs the synthesized signal y(n) of the amplified first analog signal $as_1(n)'$ and the amplified second analog signal $as_2(n)'$ to each of the outside of the amplification device 1 and the ADC 15.

The ADC 15 converts the synthesized signal y(n) output from the signal synthesizing unit 14c from an analog signal to a digital signal.

The ADC 15 outputs the digital signal to the error calculating unit 16 as the digital synthesized signal dy(n).

The error calculating unit 16 acquires the digital synthesized signal dy(n) output from the ADC 15, and acquires the transmission signal x(n).

The error calculating unit 16 multiplies the digital synthesized signal dy(n) by a reciprocal of a gain G of the Doherty amplifier 14, and calculates the error signal $\Delta e(n)$ indicating the error between the digital synthesized signal after being multiplied by the reciprocal and the transmission signal x(n) as expressed by following equation (3) (step ST3 in FIG. 5).

$$\Delta e(n) = x(n) - \frac{dy(n)}{G} \qquad (3)$$

The error calculating unit 16 outputs the error signal $\Delta e(n)$ to each of the controlling unit 17 and the compensation coefficient calculating unit 11a.

When receiving the error signal $\Delta e(n)$ from the error calculating unit 16, the controlling unit 17 controls the amplitude of each of the first signal $s_1(n)$ and the second signal $s_2(n)$ output from the signal dividing unit 12 depending on the error indicated by the error signal $\Delta e(n)$ (step ST4 in FIG. 5).

The controlling unit 17 also controls the phase difference between the first signal $s_1(n)$ output from the signal dividing unit 12 and the second signal $s_2(n)$ output from the signal dividing unit 12 depending on the error indicated by the error signal $\Delta e(n)$ (step ST5 in FIG. 5).

Hereinafter, amplitude control processing and phase control processing by the controlling unit 17 are specifically described.

The controlling unit 17 includes a table (refer to FIG. 6) including a first amplitude coefficient $amp_1$ that is an amplitude coefficient of the first signal $s_1(n)$ corresponding to an error $e^{(i)}$, a second amplitude coefficient $amp_2$ that is an amplitude coefficient of the second signal $s_2(n)$ corresponding to the error $e^{(i)}$, and a phase difference $\Delta ph$ corresponding to the error $e^{(i)}$.

FIG. 6 is an explanatory diagram illustrating an example of the table included in the controlling unit 17.

In the table illustrated in FIG. 6, the error $e^{(i)}$ having a range of five corresponds to the first amplitude coefficient $amp_1$, the second amplitude coefficient $amp_2$, and the phase difference $\Delta ph$. However, this is merely an example, and for example, the error $e^{(i)}$ of a certain value, such as $e^{(i)}=1$ and $e^{(i)}=2$, may correspond to the first amplitude coefficient $amp_1$, the second amplitude coefficient $amp_2$, and the phase difference $\Delta ph$.

Note that, the first amplitude coefficient $amp_1$, the second amplitude coefficient $amp_2$, and the phase difference $\Delta ph$ are obtained by computer simulation, for example.

Every time the error signal $\Delta e(n)$ is received from the error calculating unit 16, the controlling unit 17 calculates the error $e^{(i)}$ as expressed by following equation (4).

$$e^{(i)}=e^{(i-1)}+\Delta e(n) \qquad (4)$$

wherein i=1, 2, . . . , I. $e^{(0)}=0$.

For example, when I=10, the controlling unit 17 calculates an error $e^{(1)}$, an error $e^{(2)}$, . . . , and an error $e^{(10)}$. After calculating the error $e^{(10)}$, the controlling unit 17 returns i to 1, and repeatedly performs the processing of calculating the error $e^{(1)}$, the error $e^{(2)}$, . . . , and the error $e^{(10)}$ again.

For example, when I=100, the controlling unit 17 repeatedly performs the processing of calculating the error $e^{(1)}$, the error $e^{(2)}$, . . . , and an error $e^{(10)}$.

Note that, when I=1, the error$^{(I)}$ ($=e^{(1)}$) matches the error signal $\Delta e(n)$, so that error $e^{(i)}$=error signal $\Delta e(n)$.

For example, when I=10, every time the error $e^{(10)}$ is calculated, the controlling unit 17 acquires the first amplitude coefficient $amp_1$ corresponding to the error $e^{(10)}$, the second amplitude coefficient $amp_2$ corresponding to the error $e^{(10)}$, and the phase difference $\Delta ph$ corresponding to the error $e^{(10)}$ from the table illustrated in FIG. 6.

When the error $e^{(10)}$ is three, for example, the controlling unit 17 acquires $amp_{1,1}$ as the first amplitude coefficient $amp_1$ corresponding to the error $e^{(10)}$, and acquires $amp_{2,1}$ as the second amplitude coefficient $amp_2$ corresponding to the error $e^{(10)}$. The controlling unit 17 acquires $\Delta ph_1$ as the phase difference $\Delta ph$ corresponding to the error $e^{(10)}$.

When the error $e^{(10)}$ is seven, for example, the controlling unit 17 acquires $amp_{1,2}$ as the first amplitude coefficient $amp_1$ corresponding to the error $e^{(10)}$, and acquires $amp_{2,2}$ as the second amplitude coefficient $amp_2$ corresponding to the error $e^{(10)}$. The controlling unit 17 also acquires $\Delta ph_2$ as the phase difference $\Delta ph$ corresponding to the error $e^{(10)}$.

The controlling unit 17 performs each of the amplitude control processing and the phase control processing by outputting the first amplitude coefficient $amp_1$, the second amplitude coefficient $amp_2$, and the phase difference $\Delta ph$ to the signal dividing unit 12.

For example, when I=10, every time the error calculating unit 16 calculates the error signal $\Delta e(n)$ 10 times, the controlling unit 17 outputs the first amplitude coefficient $amp_1$, the second amplitude coefficient $amp_2$, and the phase difference $\Delta ph$ to the signal dividing unit 12.

For example, when I=100, every time the error calculating unit 16 calculates the error signal $\Delta e(n)$ 100 times, the controlling unit 17 outputs the first amplitude coefficient $amp_1$, the second amplitude coefficient $amp_2$, and the phase difference $\Delta ph$ to the signal dividing unit 12.

The signal dividing unit 12 generates the first signal $s_1(n)$ and the second signal $s_2(n)$ using each of the first amplitude coefficient $amp_1$, the second amplitude coefficient $amp_2$, and the phase difference $\Delta ph$ output from the controlling unit 17.

Hereinafter, generation processing of the first signal $s_1(n)$ and the second signal $s_2(n)$ by the signal dividing unit 12 is specifically described.

The signal dividing unit 12 multiplies the distortion compensation signal z(n) output from the compensation coefficient calculating unit 11a by the first amplitude coefficient $amp_1$ output from the controlling unit 17 as expressed by following equation (5).

The signal dividing unit 12 outputs the distortion compensation signal after being multiplied by the first amplitude coefficient to the DAC 13a as the first signal $s_1(n)$.

$$s_1(n)=amp_1 \times z(n) \qquad (5)$$

The distortion compensation signal z(n) is a complex signal and is expressed by following equation (6).

$$z(n)=A(n) \times \exp(\theta(n)) \qquad (6)$$

In equation (6), A(n) represents the amplitude of the distortion compensation signal z(n), and $\theta(n)$ represents the phase of the distortion compensation signal z(n).

The signal dividing unit 12 multiplies the distortion compensation signal z(n) output from the compensation coefficient calculating unit 11a by the second amplitude coefficient $amp_2$ output from the controlling unit 17 as expressed by following equation (7).

Further, the signal dividing unit 12 adds the phase difference $\Delta ph$ to the phase $\theta(n)$ of the distortion compensation signal after being multiplied by the second amplitude coefficient as expressed by following equation (7).

The signal dividing unit 12 outputs the distortion compensation signal after the phase difference is added to the DAC 13b as the second signal $s_2(n)$.

$$s_2(n)=amp_2 \times A(n) \times \exp(\theta(n)+\Delta ph) \qquad (7)$$

For example, when I=10, every time the error signal $\Delta e(n)$ is output 10 times from the error calculating unit 16, a new first amplitude coefficient $amp_1$ is output from the controlling unit 17. In other words, the new first amplitude coefficient $amp_1$ is not output until the error signal $\Delta e(n)$ is output 10 times from the error calculating unit 16.

Therefore, the first signals $s_1(n)$ for n=1, 2, . . . , 10 are calculated by the signal dividing unit 12 using the same first amplitude coefficient $amp_1$.

The first signals $s_1(n)$ for n=11, 12, . . . , 20 are calculated by the signal dividing unit 12 using the new first amplitude coefficient $amp_1$ different from the above-described first amplitude coefficient $amp_1$.

For example, when I=10, every time the error signal $\Delta e(n)$ is output 10 times from the error calculating unit 16, a new second amplitude coefficient $amp_2$ and a new phase difference $\Delta ph$ are output from the controlling unit 17. In other words, the new second amplitude coefficient $amp_2$ and the new phase difference $\Delta ph$ are not output until the error signal $\Delta e(n)$ is output 10 time from the error calculating unit 16.

Therefore, the second signals $s_2(n)$ for n=1, 2, . . . , 10 are calculated by the signal dividing unit 12 using the same second amplitude coefficient $amp_2$ and the same phase difference $\Delta ph$.

The second signals $s_2(n)$ for n=11, 12, . . . , 20 are calculated by the signal dividing unit 12 using the new second amplitude coefficient $amp_2$ different from the above-described second amplitude coefficient amp$_2$ and the new phase difference Δph different from the above-described phase difference Δph.

In the first embodiment described above, the amplitude and phase control device 10 is provided with the signal dividing unit 12 that divides the transmission signal into the first signal and the second signal, and outputs each of the first signal and the second signal to the Doherty amplifier 14, the error calculating unit 16 that acquires, from the Doherty amplifier 14, the synthesized signal of the first signal amplified by the Doherty amplifier 14 and the second signal amplified by the Doherty amplifier 14, performs multiplication of the synthesized signal by the reciprocal of the gain of the Doherty amplifier 14, and performs calculation of the error between the synthesized signal after the multiplication by the reciprocal and the transmission signal, and the controlling unit 17 that controls the amplitude of each of the first signal and the second signal output from the signal dividing unit 12 depending on the error calculated by the error calculating unit 16 and controls the phase difference between the first signal output from the signal dividing unit 12 and the second signal output from the signal dividing unit 12 depending on the error. Therefore, even when the non-linear characteristic of the Doherty amplifier 14 changes, the amplitude and phase control device 10 can reduce the distortion included in the synthesized signal output from the Doherty amplifier 14.

The amplitude and phase control device 10 illustrated in FIG. 2 is provided with the distortion compensating unit 11. However, even when the amplitude and phase control device 10 is not provided with the distortion compensating unit 11, this may reduce the distortion included in the synthesized signal y(n) output from the Doherty amplifier 14 when the non-linear characteristic of the Doherty amplifier 14 changes.

In a case where the amplitude and phase control device 10 is not provided with the distortion compensating unit 11, the signal dividing unit 12 multiplies the first amplitude coefficient amp$_1$ output from the controlling unit 17 by the transmission signal x(n).

The signal dividing unit 12 outputs the transmission signal after being multiplied by the first amplitude coefficient to the DAC 13a as the first signal s$_1$(n).

The signal dividing unit 12 multiplies the transmission signal x(n) by the second amplitude coefficient amp$_2$ output from the controlling unit 17.

The signal dividing unit 12 also adds the phase difference Δph to the phase θ(n) of the transmission signal after being multiplied by the second amplitude coefficient.

The signal dividing unit 12 outputs the transmission signal after the phase difference is added to the DAC 13b as the second signal s$_2$(n).

In the amplitude and phase control device 10 illustrated in FIG. 2, the error calculating unit 16 calculates the error signal Δe(n) indicating the error between the digital synthesized signal dy(n)/G after being multiplied by the reciprocal and the transmission signal x(n). However, this is merely an example, and for example, as illustrated in FIG. 7, the error calculating unit 16 may calculate the error signal Δe(n) indicating an error between the digital synthesized signal dy(n)/G after being multiplied by the reciprocal and the distortion compensation signal z(n) output from the distortion compensating unit 11.

Figure 7:
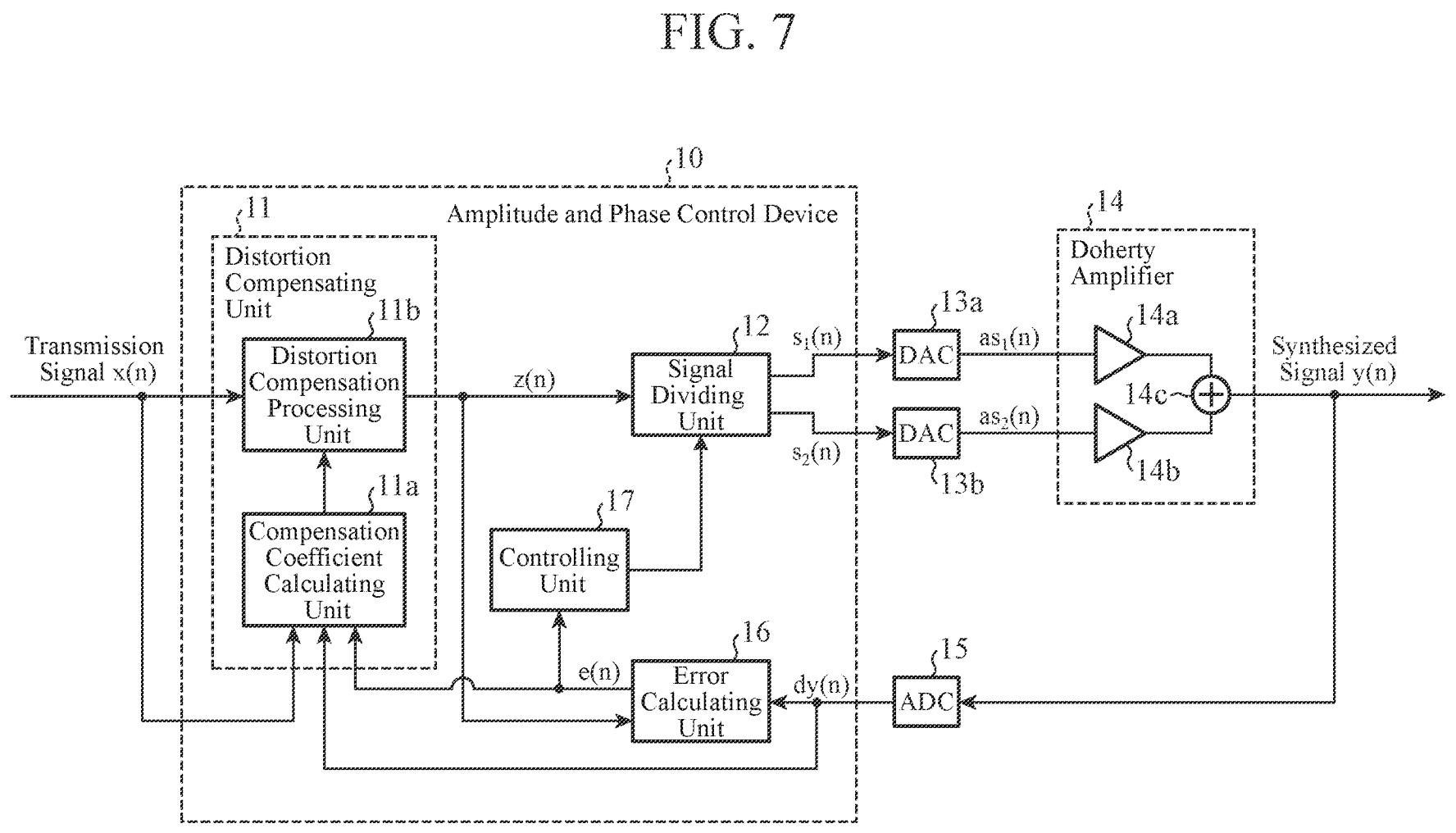

FIG. 7 is a configuration diagram illustrating the amplification device 1 including another amplitude and phase control device 10 according to the first embodiment.

In the amplitude and phase control device 10 illustrated in FIG. 2, the DAC 13a outputs the first analog signal as$_1$(n) to the carrier amplifier 14a, and the DAC 13b outputs the second analog signal as$_2$(n) to the peak amplifier 14b. However, this is merely an example, and the DAC 13a may convert a frequency of the first analog signal as$_1$(n) into, for example, a radio frequency (RF), and output the first analog signal as$_1$(n) after frequency conversion to the carrier amplifier 14a. The DAC 13b may convert a frequency of the second analog signal as$_2$(n) into, for example, RF, and output the second analog signal as$_2$(n) after frequency conversion to the peak amplifier 14b.

In the amplitude and phase control device 10 illustrated in FIG. 2, the ADC 15 outputs the digital synthesized signal dy(n) to the error calculating unit 16. However, this is merely an example, and the ADC 15 may convert a frequency of the digital synthesized signal dy(n) into, for example, a baseband frequency, and output the digital synthesized signal dy(n) after frequency conversion to the error calculating unit 16.

Second Embodiment

In a second embodiment, an amplitude and phase control device 10 in which a controlling unit 17 calculates each of a first amplitude coefficient amps, a second amplitude coefficient amp$_2$, and a phase difference Δph using a polynomial having an error as a variable is described.

A configuration of the amplitude and phase control device 10 according to the second embodiment is similar to the configuration of the amplitude and phase control device 10 according to the first embodiment, and FIGS. 2 and 7 are configuration diagrams illustrating the amplitude and phase control device 10 according to the second embodiment.

An internal memory of the controlling unit 17 stores each of a polynomial expressed by following equation (8), a polynomial expressed by following equation (9), and a polynomial expressed by following equation (10).

$$amp_1 = \alpha_0 + \alpha_1 \times e + \alpha_2 \times e^2 + \ldots \qquad (8)$$

$$amp_2 = \beta_0 + \beta_1 \times e + \beta_2 \times e^2 + \ldots \qquad (9)$$

$$\Delta ph = \gamma_0 + \gamma_1 \times e + \gamma_2 \times e^2 + \ldots \qquad (10)$$

In equations (8) to (10), $e = e^{(i)}$.

$\alpha_0$, $\alpha_1$, $\alpha_2$ . . . , $\beta_0$, $\beta_1$, $\beta_2$ . . . , and $\gamma_0$, $\gamma_1$, $\gamma_2$ . . . are constants calculated by computer simulation, for example.

The controlling unit 17 calculates an error $e^{(i)}$ from an error signal Δe(n) output from an error calculating unit 16.

Every time the error calculating unit 16 calculates I times the error signal Δe(n), the controlling unit 17 calculates the first amplitude coefficient amp$_1$ by substituting the error $e^{(I)}$ into equation (8) as the error $e^{(i)}$.

Every time the error calculating unit 16 calculates I times the error signal Δe(n), the controlling unit 17 calculates the second amplitude coefficient amp$_2$ by substituting the error $e^{(I)}$ into equation (9) as the error $e^{(i)}$.

Every time the error calculating unit 16 calculates I times the error signal Δe(n), the controlling unit 17 calculates the phase difference Δph by substituting the error $e^{(I)}$ into equation (10) as the error $e^{(i)}$.

The controlling unit 17 performs each of the amplitude control processing and the phase control processing by outputting the first amplitude coefficient amp$_1$, the second amplitude coefficient amp$_2$, and the phase difference Δph to the signal dividing unit 12.

In the second embodiment, the amplitude and phase control device 10 is configured so that the controlling unit 17 calculates each of the first amplitude coefficient amp$_1$, the second amplitude coefficient amp$_2$, and the phase difference Δph using the polynomial having the error as the variable. Even when a non-linear characteristic of a Doherty amplifier 14 changes, the amplitude and phase control device 10 according to the second embodiment can reduce distortion included in a synthesized signal y(n) output from the Doherty amplifier 14 as with the amplitude and phase control device 10 according to the first embodiment.

Third Embodiment

In a third embodiment, an amplitude and phase control device 10 provided with a power calculating unit 18 that calculates power of a transmission signal is described.

Figure 8:
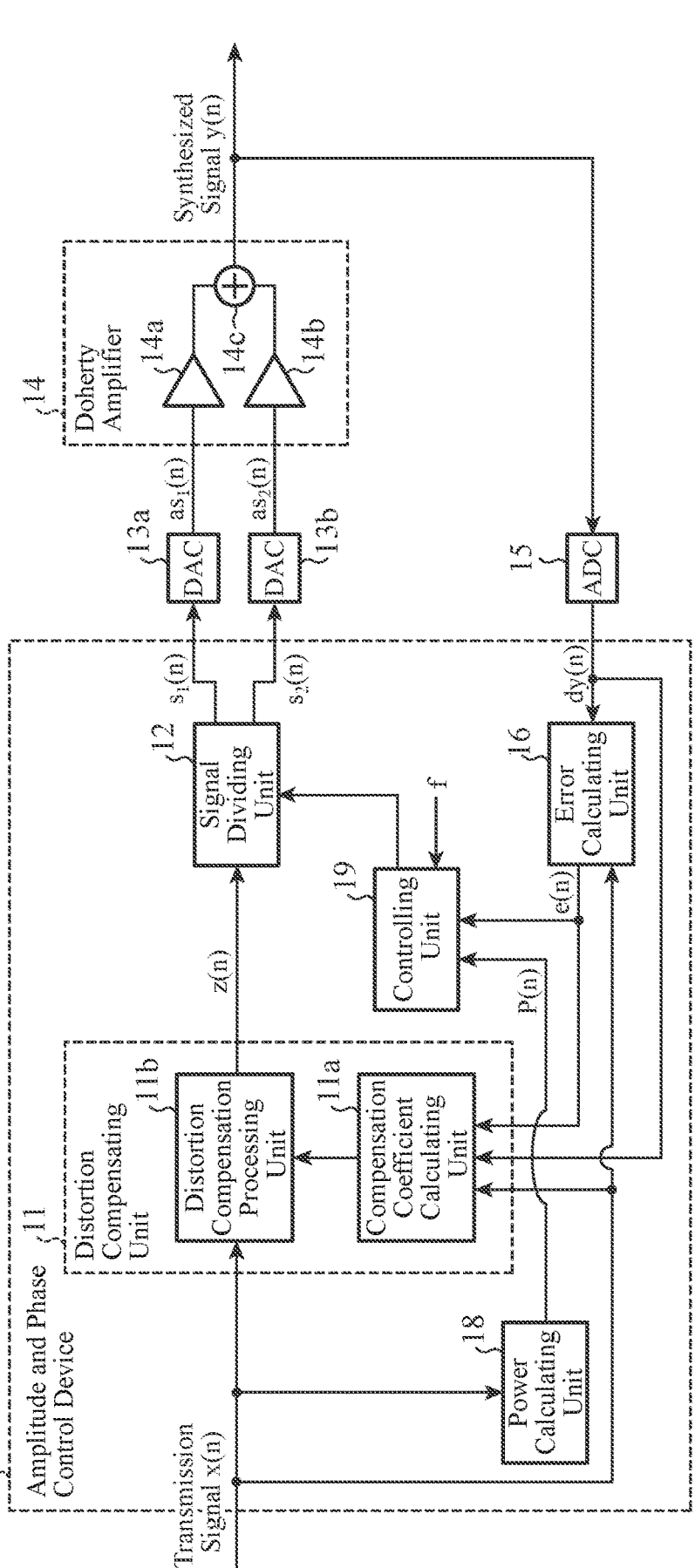
FIG. 8 is a configuration diagram illustrating an amplification device 1 including an amplitude and phase control device 10 according to a third embodiment.

FIG. 8 is a configuration diagram illustrating an amplification device 1 including the amplitude and phase control device 10 according to the third embodiment. In FIG. 8, the same reference sign as that in FIGS. 2 and 7 represents the same or corresponding part, so that the description thereof is omitted.

FIG. 9 is a hardware configuration diagram illustrating hardware of the amplitude and phase control device 10 according to the third embodiment. In FIG. 9, the same reference sign as that in FIG. 3 represents the same or corresponding part, so that the description thereof is omitted.

The power calculating unit 18 is implemented by a power calculating circuit 25 illustrated in FIG. 9, for example.

The power calculating unit 18 calculates the power of the transmission signal and outputs power information indicating the power to a controlling unit 19.

The controlling unit 19 is implemented by a controlling circuit 26 illustrated in FIG. 9, for example.

The controlling unit 19 controls an amplitude of each of a first signal and a second signal output from a signal dividing unit 12 depending on each of an error calculated by an error calculating unit 16, the power calculated by the power calculating unit 18, and a carrier frequency of the transmission signal.

The controlling unit 19 controls a phase difference between the first signal output from the signal dividing unit 12 and the second signal output from the signal dividing unit 12 depending on each of the error calculated by the error calculating unit 16, the power calculated by the power calculating unit 18, and the carrier frequency of the transmission signal.

In FIG. 8, it is assumed that each of a distortion compensating unit 11, the signal dividing unit 12, the error calculating unit 16, the power calculating unit 18, and the controlling unit 19 that are components of the amplitude and phase control device 10 is implemented by dedicated hardware as illustrated in FIG. 9. That is, it is assumed that the amplitude and phase control device 10 is implemented by a distortion compensating circuit 21, a signal dividing circuit 22, an error calculating circuit 23, the power calculating circuit 25, and the controlling circuit 26.

Each of the distortion compensating circuit 21, the signal dividing circuit 22, the error calculating circuit 23, the power calculating circuit 25, and the controlling circuit 26 corresponds to, for example, a single circuit, a composite circuit, a programmed processor, a parallel-programmed processor, an ASIC, a FPGA, or a combination thereof.

The components of the amplitude and phase control device 10 are not limited to those implemented by the dedicated hardware, and the amplitude and phase control device 10 may also be implemented by software, firmware, or a combination of the software and firmware.

In a case where the amplitude and phase control device 10 is implemented by the software, firmware or the like, a program for causing the computer to execute each processing procedure performed in the distortion compensating unit 11, the signal dividing unit 12, the error calculating unit 16, the power calculating unit 18, and the controlling unit 19 is stored in the memory 31 illustrated in FIG. 4. The processor 32 illustrated in FIG. 4 executes the program stored in the memory 31.

FIG. 9 illustrates an example in which each of the components of the amplitude and phase control device 10 is implemented by the dedicated hardware, and FIG. 4 illustrates an example in which the amplitude and phase control device 10 is implemented by the software, firmware or the like. However, this is merely an example, and some components in the amplitude and phase control device 10 may be implemented by the dedicated hardware, and the remaining components may be implemented by the software, firmware or the like.

Next, an operation of the amplification device 1 illustrated in FIG. 8 is described. Note that, since units other than the power calculating unit 18 and the controlling unit 19 are similar to those of the amplification device 1 illustrated in FIG. 2, only operations of the power calculating unit 18 and the controlling unit 19 are hereinafter described.

The power calculating unit 18 calculates instantaneous power of a transmission signal x(n) as power P(n) of the transmission signal x(n), and outputs power information indicating the power P(n) to the controlling unit 19.

The controlling unit 19 acquires an error signal Δe(n) from the error calculating unit 16, acquires the power information from the power calculating unit 18, and acquires a carrier frequency f.

The controlling unit 19 controls amplitude of each of a first signal s$_1$(n) and a second signal s$_2$(n) output from the signal dividing unit 12 depending on each of an error indicated by the error signal Δe(n), the power P(n) indicated by the power information, and the carrier frequency f of the transmission signal x(n).

The controlling unit 19 also controls the phase difference between the first signal s$_1$(n) output from the signal dividing unit 12 and the second signal s$_2$(n) output from the signal dividing unit 12 depending on each of the error indicated by the error signal Δe(n), the power P(n) indicated by the power information, and the carrier frequency f of the transmission signal x(n).

Hereinafter, amplitude control processing and phase control processing by the controlling unit 19 are specifically described.

The controlling unit 19 includes a table (refer to FIG. 10) including a first amplitude coefficient amps corresponding to a combination of an error e$^{(i)}$, the power P, and the carrier frequency f, a second amplitude coefficient amp$_2$ corresponding to the combination of the error e$^{(i)}$, the power P, and the carrier frequency f, and a phase difference Δph corresponding to the combination of the error e$^{(i)}$, the power P, and the carrier frequency f.

FIG. 10 is an explanatory diagram illustrating an example of the table included in the controlling unit 19.

In the table illustrated in FIG. 10, the error e$^{(i)}$ having a range of five corresponds to the first amplitude coefficient amp$_1$, the second amplitude coefficient amp$_2$, and the phase difference Δph. However, this is merely an example, and for example, the error e$^{(i)}$ of a certain value, such as e$^{(i)}$=1 and $e^{(i)}$=2, may correspond to the first amplitude coefficient $amp_1$, the second amplitude coefficient $amp_2$, and the phase difference $\Delta ph$.

Note that, the first amplitude coefficient $amp_1$, the second amplitude coefficient $amp_2$, and the phase difference $\Delta ph$ are obtained by computer simulation, for example.

Every time the controlling unit 19 receives the error signal $\Delta e(n)$ from the error calculating unit 16, this calculates the error $e^{(i)}$ as expressed by equation (4) as with the controlling unit 17 illustrated in FIG. 2.

For example, when I=10, every time the controlling unit 19 calculates the error $e^{(10)}$, this acquires the first amplitude coefficient $amp_1$ corresponding to the combination of the error $e^{(10)}$, the power $P(n)$, and the carrier frequency f from the table illustrated in FIG. 10.

The controlling unit 19 also acquires the second amplitude coefficient $amp_2$ corresponding to the combination of the error $e^{(10)}$, the power $P(n)$, and the carrier frequency f from the table illustrated in FIG. 10.

The controlling unit 19 also acquires the phase difference $\Delta ph$ corresponding to the combination of the error $e^{(10)}$, the power $P(n)$, and the carrier frequency f from the table illustrated in FIG. 10.

When the error $e^{(10)}$ is three, the power $P(n)$ is $P_1$, and the carrier frequency f is $f_1$, the controlling unit 19 acquires $amp_{1,1}$ as the first amplitude coefficient $amp_1$, and acquires $amp_{2,1}$ as the second amplitude coefficient $amp_2$. The controlling unit 19 also acquires $\Delta ph_1$ as the phase difference ph.

When the error $e^{(10)}$ is eight, the power $P(n)$ is $P_2$, and the carrier frequency f is $f_1$, the controlling unit 19 acquires $amp_{1,12}$ as the first amplitude coefficient $amp_1$, and acquires $amp_{2,12}$ as the second amplitude coefficient $amp_2$. The controlling unit 19 acquires $\Delta ph_{12}$ as the phase difference $\Delta ph$.

The controlling unit 19 performs each of the amplitude control processing and the phase control processing by outputting the first amplitude coefficient $amp_1$, the second amplitude coefficient $amp_2$, and the phase difference $\Delta ph$ to the signal dividing unit 12.

In the above-described third embodiment, the amplitude and phase control device 10 is provided with the power calculating unit 18 that calculates the power of the transmission signal. The amplitude and phase control device 10 illustrated in FIG. 8 is configured so that the controlling unit 19 controls the amplitude of each of the first signal and the second signal output from the signal dividing unit 12 depending on each of the error calculated by the error calculating unit 16, the power calculated by the power calculating unit 18, and the carrier frequency of the transmission signal, and controls the phase difference between the first signal output from the signal dividing unit 12 and the second signal output from the signal dividing unit 12 depending on each of the error calculated by the error calculating unit 16, the power calculated by the power calculating unit 18, and the carrier frequency of the transmission signal. Therefore, even when a non-linear characteristic of the Doherty amplifier 14 changes, the amplitude and phase control device 10 illustrated in FIG. 8 can reduce distortion included in a synthesized signal output from the Doherty amplifier 14.

The amplitude and phase control device 10 illustrated in FIG. 8 can further reduce the distortion included in synthesized signal output from the Doherty amplifier 14 as compared with the amplitude and phase control device 10 illustrated in FIG. 2.

In the amplitude and phase control device 10 illustrated in FIG. 8, the power calculating unit 18 calculates the power $P(n)$ of the transmission signal x(n). However, this is merely an example, and as illustrated in FIG. 11, the power calculating unit 18 may calculate the power $P(n)$ of a distortion compensation signal z(n) output from the compensation coefficient calculating unit 11*a*.

Figure 11:
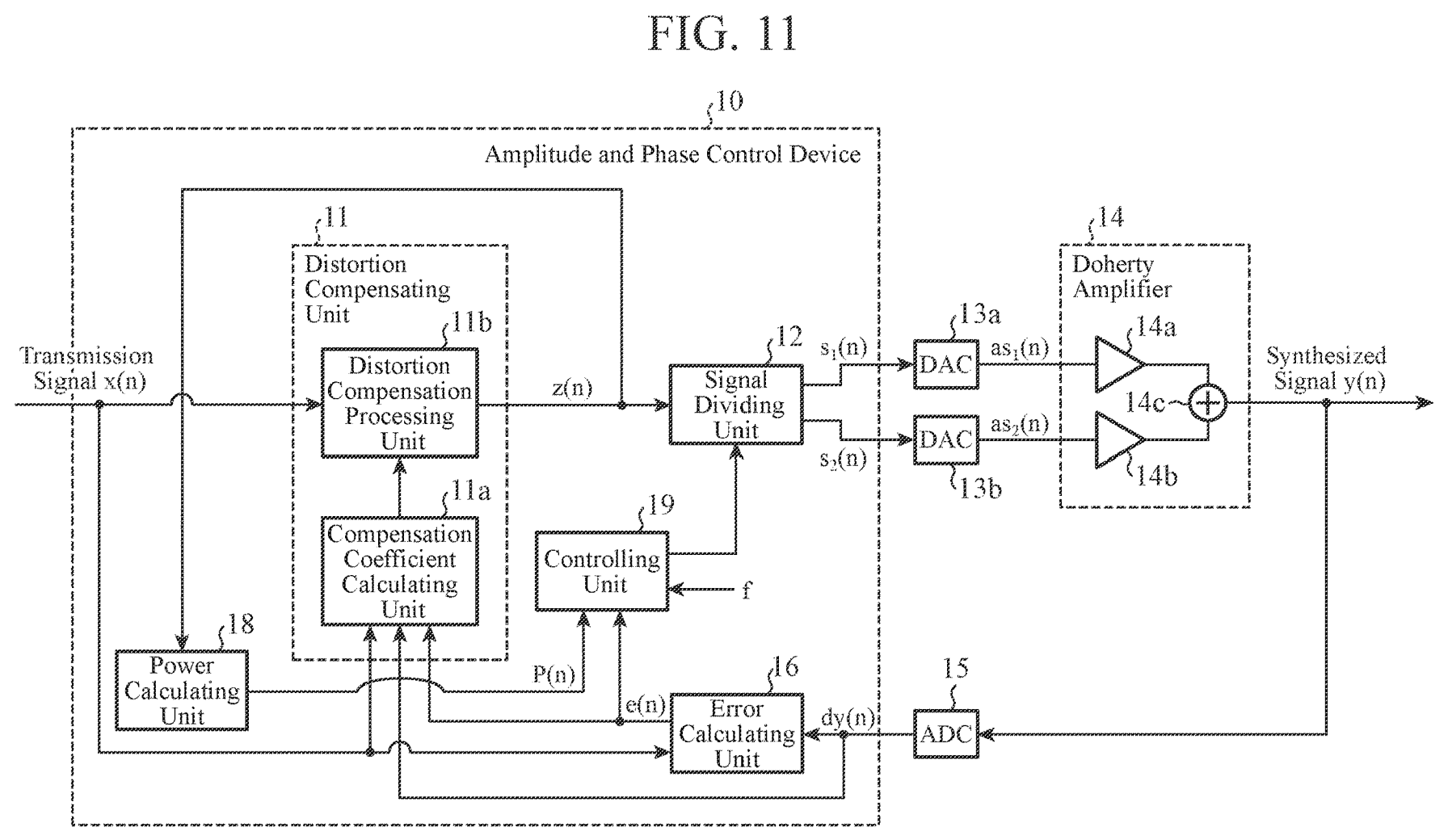

FIG. 11 is a configuration diagram illustrating the amplification device 1 including another amplitude and phase control device 10 according to the third embodiment.

Fourth Embodiment

In a fourth embodiment, an amplitude and phase control device 10 in which a controlling unit 19 calculates each of a first amplitude coefficient $amp_1$, a second amplitude coefficient $amp_2$, and a phase difference $\Delta ph$ using a polynomial having each of an error, power, and a carrier frequency as a variable is described.

A configuration of the amplitude and phase control device 10 according to the fourth embodiment is similar to the configuration of the amplitude and phase control device 10 according to the third embodiment, and FIGS. 8 and 11 are configuration diagrams illustrating the amplitude and phase control device 10 according to the fourth embodiment.

An internal memory of the controlling unit 19 stores each of a polynomial expressed by following equation (11), a polynomial expressed by following equation (12), and a polynomial expressed by following equation (13).

$$amp_1=a_0+a_1\times e+a_2\times e^2+\ldots+b_0+b_1\times e+b_2\times e^2+\ldots \\ c_0+c_1\times e+c_2\times e^2+\ldots \tag{11}$$

$$amp_2=d_0+d_1\times e+d_2\times e^2+\ldots+g_0+g_1\times e+g_2\times e^2+\ldots \\ h_0+h_1\times e+h_2\times e^2+ \tag{12}$$

$$\Delta ph=k_0+k_1\times e+k_2\times e^2+\ldots+m_0+m_1\times e+m_2\times e^2+\ldots \\ n_0+n_1\times e+n_2\times e^2+\ldots \tag{13}$$

In equations (11) to (13), $e=e^{(i)}$.

$a_0, a_1, a_2 \ldots, b_0, b_1, b_2 \ldots$, and $c_0, c_1, c_2 \ldots$ are constants calculated by computer simulation, for example.

$d_0, d_1, d_2, \ldots, g_0, g_1, g_2 \ldots$, and $h_0, h_1, h_2 \ldots$ are constants calculated by computer simulation, for example.

$k_0, k_1, k_2 \ldots, m_0, m_1, m_2 \ldots$, and $n_0, n_1, n_2 \ldots$ are constants calculated by computer simulation, for example.

The controlling unit 19 calculates an error $e^{(i)}$ from an error signal $\Delta e(n)$ output from the error calculating unit 16.

Every time the error calculating unit 16 calculates I times the error signal $\Delta e(n)$, the controlling unit 19 calculates the first amplitude coefficient $amp_1$ by substituting the error $e^{(I)}$ into equation (11) as the error $e^{(i)}$ and by substituting each of power $P(n)$ and a carrier frequency f into equation (11).

Every time the error calculating unit 16 calculates I times the error signal $\Delta e(n)$, the controlling unit 19 calculates the second amplitude coefficient $amp_2$ by substituting the error $e^{(I)}$ into equation (12) as the error $e^{(i)}$ and by substituting each of power $P(n)$ and a carrier frequency f into equation (12).

Every time the error calculating unit 16 calculates I times the error signal $\Delta e(n)$, the controlling unit 19 calculates the phase difference $\Delta ph$ by substituting the error $e^{(I)}$ into equation (13) as the error $e^{(i)}$ and by substituting each of power $P(n)$ and a carrier frequency f into equation (13).

The controlling unit 19 performs each of the amplitude control processing and the phase control processing by outputting the first amplitude coefficient $amp_1$, the second amplitude coefficient $amp_2$, and the phase difference $\Delta ph$ to the signal dividing unit 12.

In the fourth embodiment, the amplitude and phase control device 10 is configured so that the controlling unit 19 calculates each of the first amplitude coefficient amp$_1$, the second amplitude coefficient amp$_2$, and the phase difference Δph using the polynomial having each of the error, the power, and the carrier frequency as the variable is described. Even when a non-linear characteristic of a Doherty amplifier 14 changes, the amplitude and phase control device 10 according to the fourth embodiment can reduce distortion included in a synthesized signal output from the Doherty amplifier 14 as with the amplitude and phase control device 10 according to the third embodiment.

Note that, in the present disclosure, the embodiments may be freely combined, any component of each embodiment may be modified, or any component may be omitted in each embodiment.

INDUSTRIAL APPLICABILITY

The present disclosure is suitable for an amplitude and phase control device and an amplitude and phase control method for outputting each of a first signal and a second signal to a Doherty amplifier.

The present disclosure is suitable for an amplification device provided with an amplitude and phase control device and a Doherty amplifier.

The present disclosure is suitable for a radio transmitter provided with an amplification device.

REFERENCE SIGNS LIST

1: amplification device, 2: transmission antenna, 10: amplitude and phase control device, 11: distortion compensating unit, 11*a*: compensation coefficient calculating unit, 11*b*: distortion compensation processing unit, 12: signal dividing unit, 13*a*, 13*b*: DAC, 14: Doherty amplifier, 14*a*: carrier amplifier, 14*b*: peak amplifier, 14*c*: signal synthesizing unit, 15: ADC, 16: error calculating unit, 17: controlling unit, 18: power calculating unit, 19: controlling unit, 21: distortion compensating circuit, 22: signal dividing circuit, 23: error calculating circuit, 24: controlling circuit, 25: power calculating circuit, 26: controlling circuit

The invention claimed is:

1. An amplitude and phase control device comprising processing circuitry to divide, by a signal dividing circuit, a transmission signal into a first signal and a second signal, and output each of the first signal and the second signal to a Doherty amplifier, to acquire, from the Doherty amplifier, a synthesized signal of a first signal amplified by the Doherty amplifier and a second signal amplified by the Doherty amplifier, perform multiplication of the synthesized signal by a reciprocal of a gain of the Doherty amplifier, and perform calculation of an error between the synthesized signal after the multiplication by the reciprocal and the transmission signal, and to control an amplitude of each of the first signal and the second signal depending on an amplitude coefficient corresponding to the error when a number of times of the calculation of the error reaches a predetermined number of times every time when the number of times reaches the predetermined number of times, and control a phase difference between the first signal and the second signal depending on the phase difference corresponding to the error when the number of times reaches the predetermined number of times, wherein the processing circuitry further calculates power of the transmission signal,

wherein the processing circuitry controls the amplitude of each of the first signal and the second signal depending on each of the amplitude coefficient corresponding to the error when the number of times of the calculation of the error reaches the predetermined number of times every time when the number of times reaches the predetermined number of times, the power, and a carrier frequency of the transmission signal, and the processing circuitry controls the phase difference between the first signal and the second signal depending on each of the phase difference corresponding to the error when the number of times reaches the predetermined number of times, the power, and the carrier frequency of the transmission signal, and wherein the processing circuitry includes a table including a first amplitude coefficient that is an amplitude coefficient of the first signal corresponding to a combination of an error, power, and a carrier frequency, a second amplitude coefficient that is an amplitude coefficient of the second signal corresponding to the combination of an error, power, and a carrier frequency, and the phase difference corresponding to the combination of an error, power, and a carrier frequency, the processing circuitry acquires, from the table, the first amplitude coefficient corresponding to the combination of the error, the power, and the carrier frequency of the transmission signal, the second amplitude coefficient corresponding to the combination of the error, the power, and the carrier frequency of the transmission signal, and the phase difference corresponding to the combination of the error, the power, and the carrier frequency of the transmission signal, and outputs each of the acquired first amplitude coefficient, the acquired second amplitude coefficient, and the acquired phase difference to the signal dividing circuit, and the processing circuitry performs multiplication of the transmission signal before being divided by the first amplitude coefficient, and outputs the transmission signal after the multiplication by the first amplitude coefficient to the Doherty amplifier as the first signal, and the processing circuitry performs multiplication of the transmission signal before being divided by the second amplitude coefficient, performs addition of the phase difference to a phase of the transmission signal after the multiplication by the second amplitude coefficient, and outputs the transmission signal after the addition of the phase difference to the Doherty amplifier as the second signal.

2. The amplitude and phase control device according to claim 1, wherein the processing circuitry further performs to generate a distortion compensation signal for reducing distortion included in the synthesized signal by performing distortion compensation processing on the transmission signal, and output the distortion compensation signal to the signal dividing circuit as the transmission signal.

3. The amplitude and phase control device according to claim 2, wherein the processing circuitry calculates an error between the synthesized signal after the multiplication by the reciprocal and the distortion compensation signal instead of calculating the error between the synthesized signal after the multiplication by the reciprocal and the transmission signal.

4. The amplitude and phase control device according to claim 2, wherein the processing circuitry further calculates power of the distortion compensation signal, wherein the processing circuitry controls the amplitude of each of the first signal and the second signal depending on each of the amplitude coefficient corresponding to the error when the number of times of the calculation of the error reaches the predetermined number of times every time when the number of times reaches the predetermined number of times, the power, and a carrier frequency of the transmission signal, and the processing circuitry controls the phase difference between the first signal and the second signal depending on each of the phase difference corresponding to the error when the number of times reaches the predetermined number of times, the power, and the carrier frequency of the transmission signal.

5. The amplitude and phase control device according to claim 1, wherein the processing circuitry includes a table including a first amplitude coefficient that is an amplitude coefficient of the first signal corresponding to the error, a second amplitude coefficient that is an amplitude coefficient of the second signal corresponding to the error, and the phase difference corresponding to the error, the processing circuitry acquires, from the table, the first amplitude coefficient corresponding to the error, the second amplitude coefficient corresponding to the error, and the phase difference corresponding to the error, and outputs each of the first amplitude coefficient acquired, the second amplitude coefficient acquired, and the phase difference acquired to the signal dividing circuit, the processing circuitry performs multiplication of the transmission signal before being divided by the first amplitude coefficient, and outputs the transmission signal after the multiplication by the first amplitude coefficient to the Doherty amplifier as the first signal, and the processing circuitry performs multiplication of the transmission signal before being divided by the second amplitude coefficient, adds the phase difference to a phase of the transmission signal after the multiplication by the second amplitude coefficient, and outputs the transmission signal after the phase difference is added to the Doherty amplifier as the second signal.

6. The amplitude and phase control device according to claim 1, wherein the processing circuitry calculates, using a polynomial having the error as a variable, a first amplitude coefficient corresponding to the error, a second amplitude coefficient corresponding to the error, and a phase difference corresponding to the error, and outputs each of the first amplitude coefficient, the second amplitude coefficient, and the phase difference to the signal dividing circuit, the processing circuitry performs multiplication of the transmission signal before being divided by the first amplitude coefficient, and outputs the transmission signal after the multiplication by the first amplitude coefficient to the Doherty amplifier as the first signal, and the processing circuitry performs multiplication of the transmission signal before being divided by the second amplitude coefficient, performs addition of the phase difference to a phase of the transmission signal after the multiplication by the second amplitude coefficient, and outputs the transmission signal after the addition of the phase difference to the Doherty amplifier as the second signal.

7. An amplification device comprising:

the amplitude and phase control device according to claim 1.

8. A radio transmitter comprising the amplification device according to claim 7 as an amplification device to amplify the transmission signal.

9. An amplitude and phase control device comprising processing circuitry to divide, by a signal dividing circuit, a transmission signal into a first signal and a second signal, and output each of the first signal and the second signal to a Doherty amplifier, to acquire, from the Doherty amplifier, a synthesized signal of a first signal amplified by the Doherty amplifier and a second signal amplified by the Doherty amplifier, perform multiplication of the synthesized signal by a reciprocal of a gain of the Doherty amplifier, and perform calculation of an error between the synthesized signal after the multiplication by the reciprocal and the transmission signal, and to control an amplitude of each of the first signal and the second signal depending on an amplitude coefficient corresponding to the error when a number of times of the calculation of the error reaches a predetermined number of times every time when the number of times reaches the predetermined number of times, and control a phase difference between the first signal and the second signal depending on the phase difference corresponding to the error when the number of times reaches the predetermined number of times, wherein the processing circuitry further calculates power of the transmission signal, wherein the processing circuitry controls the amplitude of each of the first signal and the second signal depending on each of the amplitude coefficient corresponding to the error when the number of times of the calculation of the error reaches the predetermined number of times every time when the number of times reaches the predetermined number of times, the power, and a carrier frequency of the transmission signal, and the processing circuitry controls the phase difference between the first signal and the second signal depending on each of the phase difference corresponding to the error when the number of times reaches the predetermined number of times, the power, and the carrier frequency of the transmission signal, and wherein the processing circuitry calculates, using a polynomial having each of an error, power, and a carrier frequency as a variable, a first amplitude coefficient corresponding to a combination of the error, the power, and the carrier frequency of the transmission signal, a second amplitude coefficient corresponding to the combination of the error, the power, and the carrier frequency of the transmission signal, and a phase difference corresponding to the combination of the error, the power, and the carrier frequency of the transmission signal, and outputs each of the first amplitude coefficient, the second amplitude coefficient, and the phase difference to the signal dividing circuit, the processing circuitry performs multiplication of the transmission signal before being divided by the first amplitude coefficient, and outputs the transmission signal after the multiplication by the first amplitude coefficient to the Doherty amplifier as the first signal, and the processing circuitry performs multiplication of the transmission signal before being divided by the second amplitude coefficient, performs addition of the phase difference to a phase of the transmission signal after the multiplication by the second amplitude coefficient, and outputs the transmission signal after the addition of the phase difference to the Doherty amplifier as the second signal.

10. The amplitude and phase control device according to claim 9, wherein the processing circuitry further performs to generate a distortion compensation signal for reducing distortion included in the synthesized signal by performing distortion compensation processing on the transmission signal, and output the distortion compensation signal to the signal dividing circuit as the transmission signal.

11. The amplitude and phase control device according to claim 10, wherein the processing circuitry calculates an error between the synthesized signal after the multiplication by the reciprocal and the distortion compensation signal instead of calculating the error between the synthesized signal after the multiplication by the reciprocal and the transmission signal.

12. The amplitude and phase control device according to claim 10, wherein the processing circuitry further calculates power of the distortion compensation signal, wherein the processing circuitry controls the amplitude of each of the first signal and the second signal depending on each of the amplitude coefficient corresponding to the error when the number of times of the calculation of the error reaches the predetermined number of times every time when the number of times reaches the predetermined number of times, the power, and a carrier frequency of the transmission signal, and the processing circuitry controls the phase difference between the first signal and the second signal depending on each of the phase difference corresponding to the error when the number of times reaches the predetermined number of times, the power, and the carrier frequency of the transmission signal.

13. The amplitude and phase control device according to claim 9, wherein the processing circuitry includes a table including a first amplitude coefficient that is an amplitude coefficient of the first signal corresponding to the error, a second amplitude coefficient that is an amplitude coefficient of the second signal corresponding to the error, and the phase difference corresponding to the error, the processing circuitry acquires, from the table, the first amplitude coefficient corresponding to the error, the second amplitude coefficient corresponding to the error, and the phase difference corresponding to the error, and outputs each of the first amplitude coefficient acquired, the second amplitude coefficient acquired, and the phase difference acquired to the signal dividing circuit, the processing circuitry performs multiplication of the transmission signal before being divided by the first amplitude coefficient, and outputs the transmission signal after the multiplication by the first amplitude coefficient to the Doherty amplifier as the first signal, and the processing circuitry performs multiplication of the transmission signal before being divided by the second amplitude coefficient, adds the phase difference to a phase of the transmission signal after the multiplication by the second amplitude coefficient, and outputs the transmission signal after the phase difference is added to the Doherty amplifier as the second signal.

14. The amplitude and phase control device according to claim 9, wherein the processing circuitry calculates, using a polynomial having the error as a variable, a first amplitude coefficient corresponding to the error, a second amplitude coefficient corresponding to the error, and a phase difference corresponding to the error, and outputs each of the first amplitude coefficient, the second amplitude coefficient, and the phase difference to the signal dividing circuit, the processing circuitry performs multiplication of the transmission signal before being divided by the first amplitude coefficient, and outputs the transmission signal after the multiplication by the first amplitude coefficient to the Doherty amplifier as the first signal, and the processing circuitry performs multiplication of the transmission signal before being divided by the second amplitude coefficient, performs addition of the phase difference to a phase of the transmission signal after the multiplication by the second amplitude coefficient, and outputs the transmission signal after the addition of the phase difference to the Doherty amplifier as the second signal.

15. An amplification device comprising:
the amplitude and phase control device according to claim 8.

16. A radio transmitter comprising the amplification device according to claim 15 as an amplification device to amplify the transmission signal.

* * * * *